(12) United States Patent
Klebanoff et al.

(10) Patent No.: US 6,232,578 B1
(45) Date of Patent: May 15, 2001

(54) THERMOPHORETIC VACUUM WAND

(75) Inventors: Leonard Elliott Klebanoff, San Ramon; Daniel John Rader, Lafayette, both of CA (US)

(73) Assignee: BUV LLC, Santa Clara, CA (US)

( * ) Notice: Subject to any disclaimer, the term of this patent is extended or adjusted under 35 U.S.C. 154(b) by 0 days.

(21) Appl. No.: 09/533,600

(22) Filed: Mar. 23, 2000

Related U.S. Application Data

(62) Division of application No. 09/210,348, filed on Dec. 11, 1998, now Pat. No. 6,072,157.

(51) Int. Cl.[7] .............................. B25J 15/06; B66C 1/02; H01L 21/68

(52) U.S. Cl. ................... 219/228; 219/228; 219/521; 294/64.1; 279/3; 269/21; 438/795

(58) Field of Search .......................... 219/221, 227–230, 219/521, 526, 444.1, 209; 269/21; 414/941; 279/3; 294/64.1; 901/410; 438/795

(56) References Cited

U.S. PATENT DOCUMENTS

| | | |
|---|---|---|
| 4,042,999 | 8/1977 | Triantafyllou . |
| 4,432,635 | 2/1984 | Mayer . |
| 4,561,688 | 12/1985 | Tsutsui . |
| 4,597,551 | 7/1986 | Ciechanowski et al. . |
| 4,687,242 | 8/1987 | Von Rooy . |
| 4,744,594 | 5/1988 | Poli et al. . |
| 4,943,148 | 7/1990 | Mondragon et al. . |
| 5,061,444 * | 10/1991 | Nazaroff et al. ................... 422/40 |
| 5,172,949 | 12/1992 | Nagai et al. . |
| 5,217,273 | 6/1993 | Hendricsen et al. . |
| 5,230,741 | 7/1993 | Ven et al. . |
| 5,314,538 | 5/1994 | Maeda et al. . |
| 5,374,090 | 12/1994 | Goff . |
| 5,720,849 * | 2/1998 | Yokosuka et al. ................... 156/571 |
| 5,783,754 | 7/1998 | MacPherson . |
| 6,072,157 * | 6/2000 | Klebanoff et al. ................... 219/228 |
| 6,110,844 * | 8/2000 | Rader et al. ................... 438/795 |

FOREIGN PATENT DOCUMENTS

| | | |
|---|---|---|
| 56-26437 | 3/1981 | (JP) . |
| 62-287638 | 12/1987 | (JP) . |
| 2-260415 | 10/1990 | (JP) . |
| 5-38694 | 2/1993 | (JP) . |
| 5-150001 | 6/1993 | (JP) . |
| 5-152357 | 6/1993 | (JP) . |
| 8-78892 | 3/1996 | (JP) . |
| 90/12675 | 11/1990 | (WO) . |

OTHER PUBLICATIONS

Nazaroff, W.W., et al. "Particle Deposition from a Natural Convection Flow onto a Vertical Isothermal Flat Plate" *J. Aerosol Sci.*, vol. 18, No. 4, pp. 445–455.

* cited by examiner

*Primary Examiner*—John A. Jeffery
(74) *Attorney, Agent, or Firm*—Burns, Doane, Swecker & Mathis, L.L.P.

(57) ABSTRACT

A thermophoretic vacuum wand that is particularly suited for transporting articles in a cleanroom environment so that potential particle contaminants in the air do not become adhered to the surface of the article is described. The wand includes a housing having a platen with a front surface with suction port(s) through the platen; a vacuum source for applying a negative pressure to the suction port(s); and heating device for the object. Heating the article when it is held by the vacuum wand affords thermophoretic protection that effectively prevents particles in the air from depositing onto the article.

23 Claims, 2 Drawing Sheets

THERMOPHORETIC VACUUM WAND

This application is a divisional of application Ser. No. 09/210,348, filed Dec. 11, 1998 now U.S. Pat. No. 6,072,157.

The U.S. Government has a paid-up license in this invention and the right in limited circumstances to require the patent owner to licence others on reasonable, terms as provided for by the terms of Contract No. DE-AC04-94AL85000 awarded by the Department of Energy.

FIELD OF THE INVENTION

This invention relates to tools for grasping objects, and more particularly, to a vacuum wand used to grasp silicon wafers during the manufacture of integrated circuits whereby the amount of particle contaminants that deposit onto the silicon wafer as it is being held is reduced or eliminated.

BACKGROUND OF THE INVENTION

Integrated circuits are manufactured on thin silicon wafers which are circular in shape and typically range in diameter from four to twelve inches. The wafers undergo many different processes during the overall manufacturing cycle, and each process may be performed by a different machine in cleanrooms. It is critically important during the entire cycle that the wafers be kept as clean as possible, and that they be handled as carefully as possible to avoid damaging the integrated circuits thereon. Therefore, wafers must be transported with the utmost care from machine to machine within a clean-room manufacturing facility.

Much of the transporting of wafers during the manufacturing process is performed by automated transporters. Robotic arms remove the wafers from each processing machine and place them in a transportation rack. The rack is moved to the next processing machine where another robotic arm removes the wafers from the rack and places them in the machine. Generally, if all components maintain proper alignment in the wafer-transportation system, the entire cycle can be handled automatically. Sometimes, however, it is necessary for human intervention and, therefore, the manual grasping and transportation of wafers. Vacuum wands are used to manually transfer wafers, masks, and the like.

Current state-of-the-art cleanrooms are designed to exclude particles greater than ~0.2 micron diameter in ambient air. However, as the minimum electronic feature size decreases, so does the critical size of "killer particles." Since it is estimated that there are about 100 times more 0.05 micron particles than there are 0.2 micron particles in, for example, a Class 100 cleanroom, it is more difficult to prevent such small particles from contaminating sensitive surfaces.

SUMMARY OF THE INVENTION

The invention is directed to an improved vacuum wand device that is particularly suited for transporting articles such as wafers and masks in a cleanroom environment so that potential particle contaminants in the air do not become adhered to the surface of the article. The invention is based in part on the recognition that heating the article will effectively prevent particles in the air from depositing on the article.

Accordingly, in one aspect, the invention is directed to a vacuum apparatus, for grasping objects having a surface to be protected from particle contaminants in an environment containing particle contaminants, that includes:

a housing having a platen with a surface adapted to receive the object;

at least one suction port defined through the platen;

means for applying a negative pressure to at least one suction port; and means for heating the object.

With prior art vacuum wands, the article, e.g., wafer or mask, that is being held and transported will collect particle contaminants. The invention employs the phenomenon known as thermophoresis in which particles, residing in a gas supporting a temperature gradient, are driven away from warm surfaces toward cooler surfaces. Thermophoresis can counteract particle contamination by diffusive, electrostatic or gravitational deposition. Thermophoresis can significantly reduce (or eliminate) the amount of particle deposition on the surfaces of the heated article.

If portability is important, the wand may be heated with an attached heating element (e.g., thermoelectric heater) that is powered by a rechargeable battery. This arrangement would allow the wand to be used without an attached power cord, although a grounding wire would be desirable.

DETAILED DESCRIPTION OF THE PREFERRED EMBODIMENTS

Figure 1:
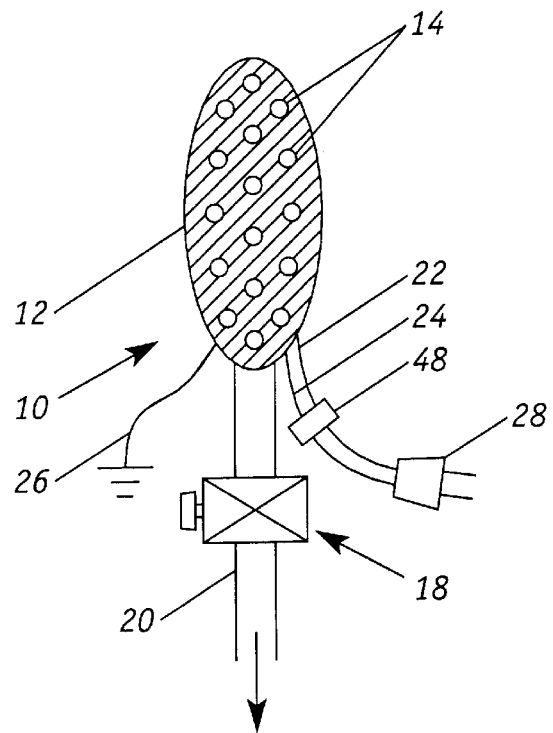
FIG. 1 is a plan view of an embodiment of the thermophoretic vacuum wand.
Figure 2:
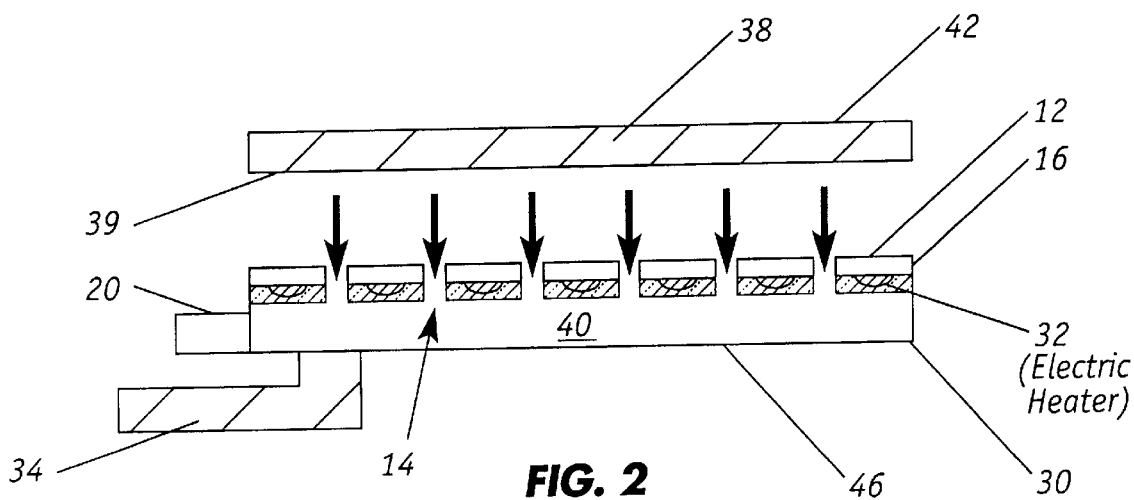
FIG. 2 is a partial cross-sectional view of the thermophoretic vacuum wand and associated wafer.

Referring to FIGS. 1 and 2, one embodiment of the thermophoretic vacuum wand 10 comprises a housing 30 having platen 16 with front surface 12 and back partition 46. The platen 16 has a plurality of apertures or suction portions 14 which are spaced apart and which are in communication with the inner chamber 40. The platen is preferably made of metal, such as aluminum or copper, or other suitable thermally conductive material. A vacuum source (not shown) is connected to the inner chamber 40 through line 20; the flow of air in the line 20 is regulated by valve 18. A heating element comprising resistive heating coil 32 is positioned within the inner chamber 40 and in thermal contact with the platen. Lines 22 and 24 from the coil 32 are electrically connected to a suitable attachment 28 (e.g., plug) that can access a source of electric current. The amount of heat generated by resistive heating coil 32 can be regulated by control (e.g., rheostat) 48 that regulates the amount of electric current.

The front surface of the vacuum thermophoretic wand is preferably configured to have the same contour as the part of the object that is to be grasped. In the case of a wafer or mask, the front surface of the platen has a flat, planar surface as shown. The area of the front surface can be less than, equal to, or greater than the surface of the wafer to be grasped. In view of the fact that wafers can be rather sizable, e.g., 300 mm in diameter, the area of the front surface of the platen will typically be smaller than that of the wafer. The size and number of the suction ports should be selected so that the back surface 39 of the wafer and the front surface of the vacuum thermophoretic wand will create a good vacuum seal. For a vacuum thermophoretic wand designed to hold wafers, the front surface of the platen should preferably have a surface area of about 1 cm$^2$ to 100 cm$^2$; the number of suction ports should preferably range from about 1 to 100.

During operation of the vacuum thermophoretic wand, the front surface 12 of the platen 16 is brought into contact with the back surface 39 of wafer 38, as shown in FIG. 2. Activation of the vacuum creates a negative pressure within the inner chamber and suction ports (relative to the ambient pressure) thereby causing the wafer to be attached to the front surface of the platen by the pressure differential. The vacuum can be broken via valve 18 to release the wafer.

Preferably, even prior to picking up the wafer with the thermophoretic vacuum wand, the resistive heating coil would have been activated to raise the front surface of the platen to a predetermined temperature. This enables the front surface of the platen to heat the wafer as soon as the two surfaces engage. It is expected that raising the wafer front surface 42 to a temperature of at least about 0.5° C. and preferably about 1° C. to about 20° C. above ambient will be sufficient to afford thermophoretic protection. This is achieved by energizing the resistive heating coil to raise the temperature of the front surface 12 of the platen to a temperature sufficient to maintain the wafer front surface at the desired temperature. This ensures that the temperature gradient is always oriented correctly, so as to drive particles away from the warmer wafer front surface 42 toward the cooler surrounding gas. As the wafer warms up, there will be established a thermal gradient across a thin boundary layer between the warm wafer front surface 42 and the adjacent gas. This gradient will drive adventitious particles, with diameters greater than 0.01 μm, away from the front surface of the wafer. While carrying the wafer with the thermophoretic vacuum wand, it is preferred that the wafer front surface 42 be oriented from between a vertical to a face down position relative to earth's gravitation field to eliminate gravitational deposition of particles. The thermophoretic vacuum wand has a grip 34 that permits the wafer to be held in any orientation thus allowing face-down transfer of the wafer.

Electrostatic deposition is a particulary potent mechanism of particle contamination. The thermophoretic vacuum wand can be designed to reduce electrostatic deposition by properly grounding the wafer or other sensitive component. When the front surface of the thermophoretic vacuum wand is made of a metal, the wand provides a means for electrically grounding the wafer being transferred. This grounding will drastically reduce electrostatic particle deposition by eliminating electric fields at the wafer surface. As shown in FIG. 1, grounding can be achieved with an electrically conductive ground wire 26 that is connected to the front surface 12 of the thermophoretic vacuum wand.

Figure 3:
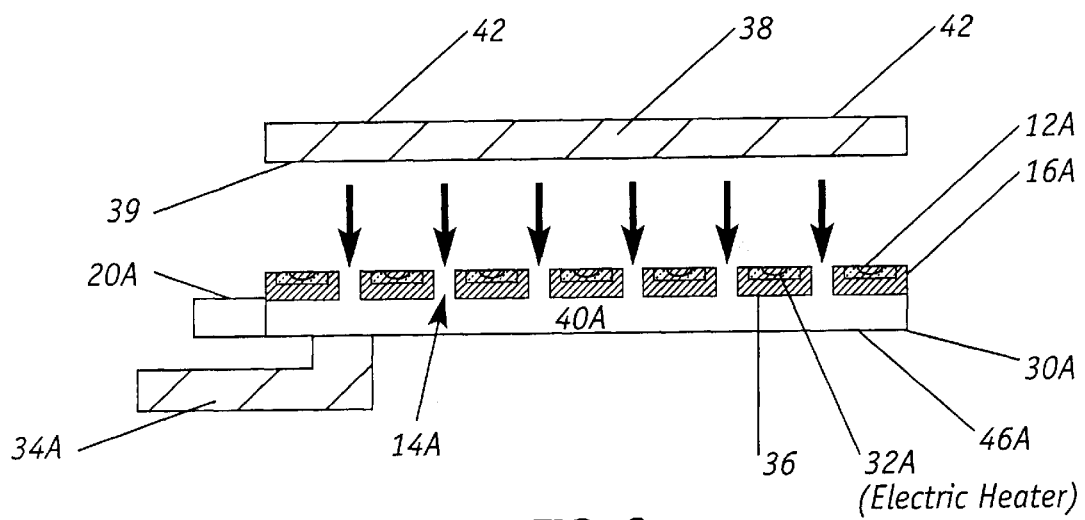
FIG. 3 is a partial cross-sectional view of another embodiment of the thermophoretic vacuum wand and associated wafer.

FIG. 3 shows an embodiment of the housing of the thermophoretic vacuum wand where the heating element may be directly in contact with the wafer back surface. The housing 30A has a platen 16A with front surface 12A and a back partition 46A to which grip 34A is attached. The platen 16A has a plurality of suction ports 14A which are connected to inner chamber 40A that is connected to vacuum line 20A. In this embodiment, heating elements 32A are positioned in grooves 36 in the platen 16A. In this fashion, the heating elements (e.g., resistive coils) can heat the wafer 38 directly. In addition, the heating elements will also heat the surrounding of front surface 12A so that some parts of the wafer surface not in contact with the heating elements will be heated indirectly. To insure a good vacuum seal the upper surface of the heating elements are flush with the front surface 12A.

Figure 4:
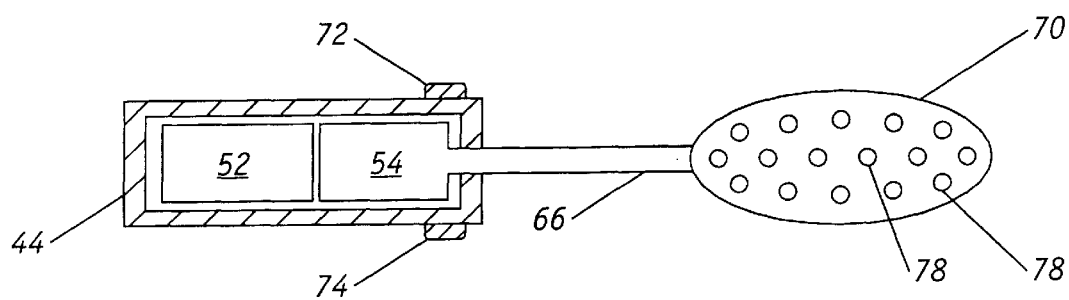
FIG. 4 is a partial cross-sectional schematic plan view of a portable thermophoretic vacuum wand.

The thermophoretic vacuum wand can be wall-mounted or portable. In the case of wall-mounted units, a central vacuum source (e.g., vacuum pump) and electrical power source in the cleanroom are connected to many thermophoretic vacuum wands. For portable units, the thermophoretic vacuum wand has a source of vacuum and energy. FIG. 4 illustrates a portable unit which includes a hollow casing 44 that contains energy source 52 (e.g., rechargeable battery) and vacuum pump 54. The vacuum pump is connected through line 66 to the inner chamber of the housing 70 having suctions ports 78. (The housing has the internal structure as described above.) Appropriate switches 72 and 74 and activate/modulate the energy source 62 and vacuum pump 64, respectively.

Besides resistive heating devices, other types of heating devices including, for example, commercially available radiant (e.g., IR) or thermoelectric heaters can be employed to generate the heat.

The level of heat applied by the heater in the thermophoretic vacuum wand can be adjusted in accordance to the thermal properties of the object being transferred. A good thermal conductor such as a silicon wafer can be heated quickly with little heater power whereas a poor thermal conductor such as a glass optical component would require a higher heater power. The heating element in the thermophoretic vacuum wand can be connected to a variable source of ac power to allow a continuously adjustable power dissipation level.

As is apparent, thermophoretic protection can also be achieved in robotic devices. In particular, the thermophoretic principals described extend to robotic transfer of masks and wafers by robotic end effectors that grasp and heat these articles during transfer.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A method of holding an object in an environment containing particle contaminants whereby negligible amounts of said particle contaminants become deposited on a front surface of the object as it is being held, the method comprising steps of:

(a) providing a vacuum apparatus that comprises:
      (i) a housing having a platen with a front surface adapted to receive the object wherein the platen defines grooves on its front surface and heating means are positioned within said grooves;
      (ii) at least one suction port defined through the platen; and
      (iii) means for applying a negative pressure to the at least one suction port;
   (b) grasping the object by vacuum so that the object is in contact with the front surface; and
   (c) heating the object so that the object front surface has a temperature that is higher than that of the environment.

2. The method of claim 1 wherein the housing comprises an inner chamber, and wherein the means for applying the negative pressure comprises a vacuum source that is coupled to said inner chamber.

3. The method of claim 1 wherein the heating means comprises a resistive heating element that is connected to a source of electrical energy.

4. The method of claim 1 wherein the heating means comprises a thermoelectric device that is connected to a source of electrical energy.

5. The method of claim 1 wherein the front surface of the platen is substantially planar and the object has a substantially planar surface and the step of grasping the object comprises contacting the planar surface of the object to the front surface of the platen to form a substantially airtight vacuum seal.

6. The method of claim 1 wherein the platen is made of metal.

7. The method of claim 1 wherein the means for applying a negative pressure comprises a vacuum source that is connected to the at least one suction port.

8. The method of claim 1 wherein the step of heating the object raises the temperature of the object front surface at least about 0.5° C. higher than that of the environment.

9. The method of claim 1 wherein the step of heating the object raises the temperature of the object front surface about 1° C. to 20° C. higher than that of the environment.

10. The method of claim 9 wherein the heating means comprises a resistive heating element that is connected to a source of electrical energy.

11. The method of claim 9 wherein the heating means comprises a thermoelectric device that is connected to a source of electrical energy.

12. The method of claim 1 further comprising grounding the object.

13. The method of claim 1 wherein the heating means has at least one surface that is flush with the front surface of the platen.

14. A method of holding an object in an environment containing particle contaminants whereby negligible amounts of said particles become deposited on a front surface of the object as it is being held, the method comprising the steps of:
   (a) providing a portable hand held vacuum apparatus that comprises:
      (i) a housing having a platen with a front surface adapted to receive a back surface of the object so that the object's front surface is exposed to the environment containing particles contaminants;
      (ii) grip member that is attached to the housing;
      (iii) at least one suction port defined through the platen; and
      (iv) means for applying a negative pressure to the at least one suction port wherein the level of negative pressure is sufficient to grasp the object on the back surface such that the object front surface defines a plane that is oriented at a vertical position, a horizontal position or a position there-in-between, with the proviso that when oriented in the horizontal position that the front face of the object faces downward; and
   (b) grasping the object by vacuum so that the object is in contact with the front surfaces of the platen; and
   (c) heating the object to a temperature sufficient to establish a thermal gradient to drive particle contaminants that are greater than 0.01 μm in diameter away from the front surface of the object.

15. The method of claim 14 wherein the housing comprises an inner chamber, and wherein said means for applying the negative pressure comprises a vacuum source that is coupled to said inner chamber.

16. The method of claim 14 wherein the vacuum apparatus includes means for heating the object comprises a resistive heating element that is connected to a source of electrical energy.

17. The method of claim 14 wherein the vacuum apparatus includes means for heating the object comprises a thermoelectric device that is connected to a source of electrical energy.

18. The method of claim 14 wherein the front surface of the platen is substantially planar and is adapted to engage a substantially planar surface of the object.

19. The method of claim 14 wherein the platen is made of metal.

20. The method of claim 14 wherein the vacuum apparatus includes means for applying a negative pressure comprises a vacuum source that is connected to the at least one suction port.

21. The method of claim 14 wherein heating the object maintains the front surface of the object at a temperature that is at least 0.5° C. higher than that of the environment.

22. The method of claim 14 wherein heating the object maintains the front surface of the object at a temperature that is about 1° C. to 20° C. higher than that of the environment.

23. The method of claim 14 wherein the platen is grounded.

* * * * *

UNITED STATES PATENT AND TRADEMARK OFFICE
CERTIFICATE OF CORRECTION

PATENT NO. : 6,232,578 B1
DATED : May 15, 2001
INVENTOR(S) : Leonard E. Klebanoff and Daniel J. Rader It is certified that error appears in the above-identified patent and that said Letters Patent is hereby corrected as shown below:

<u>Title page,</u>
Item [73], Assignee: please delete "BUV LLC" and insert -- EUV LLC -- in place thereof.

Signed and Sealed this

Thirtieth Day of April, 2002

Attest:

Attesting Officer

JAMES E. ROGAN
*Director of the United States Patent and Trademark Office*